US010557869B2

(12) United States Patent
Li et al.

(10) Patent No.: US 10,557,869 B2
(45) Date of Patent: *Feb. 11, 2020

(54) CLAMP METER

(71) Applicant: Fluke Corporation, Everett, WA (US)

(72) Inventors: Fang Li, Shanghai (CN); Jinbo He, Shanghai (CN); Chris Lagerberg, Everett, WA (US)

(73) Assignee: Fluke Corporation, Everett, WA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/173,986

(22) Filed: Oct. 29, 2018

(65) Prior Publication Data

US 2019/0064221 A1    Feb. 28, 2019

Related U.S. Application Data

(63) Continuation of application No. 15/291,973, filed on Oct. 12, 2016, now Pat. No. 10,114,043.

(30) Foreign Application Priority Data

Oct. 13, 2015   (CN) .......................... 2015 1 0669748

(51) Int. Cl.
*G01R 1/04* (2006.01)
*G01R 1/20* (2006.01)
(Continued)

(52) U.S. Cl.
CPC ...................................... *G01R 1/22* (2013.01)

(58) Field of Classification Search
CPC ... G01R 1/04; G01R 1/20; G01R 1/22; G01R 1/38; G01R 19/00; G01R 19/14;
(Continued)

(56) References Cited

U.S. PATENT DOCUMENTS 2,663,845 A    12/1953 Koch
4,316,142 A    2/1982 Kuramoto
(Continued)

FOREIGN PATENT DOCUMENTS

FR    2 315 969 A1    1/1977
JP    2004-361248 A   12/2004

OTHER PUBLICATIONS

Extended European Search Report, dated Feb. 22, 2017, for European Application No. 16193789.1-1568, 7 pages.

*Primary Examiner* — Neel D Shah
(74) *Attorney, Agent, or Firm* — Seed IP Law Group LLP

(57) ABSTRACT

A clamp meter includes a meter body and a clamp jaw assembly mounted to the meter body. The clamp jaw assembly includes a first clamp jaw and a second clamp jaw that are movable in relation to each other between a closed position and an open position. In the closed position, distal ends of the first and second clamp jaws meet to define an enclosed area between the first and second clamp jaws, and in the open position, the distal ends of the first and second clamp jaws separate from each other to define a gap allowing a wire under test to pass therethrough. The clamp meter further includes a locking slider positioned within a slot inside the meter body. A switch assembly moves the locking slider longitudinally within the slot between locked and unlocked positions. In the locked position, the locking slider blocks the first clamp jaw from movement.

20 Claims, 7 Drawing Sheets

(51) Int. Cl.

| | |
|---|---|
| *G01R 1/22* | (2006.01) |
| *G01R 1/38* | (2006.01) |
| *G01R 19/00* | (2006.01) |
| *G01R 15/18* | (2006.01) |
| *G01R 21/00* | (2006.01) |
| *G01R 31/02* | (2006.01) |
| *G01R 31/36* | (2019.01) |

(58) Field of Classification Search
CPC ........ G01R 15/18; G01R 15/20; G01R 21/00;
G01R 31/02; G01R 31/024; G01R 31/36
See application file for complete search history.

(56) References Cited

U.S. PATENT DOCUMENTS

| | | | |
|---|---|---|---|
| 5,610,512 A | | 3/1997 | Selcuk |
| 6,091,237 A | | 7/2000 | Chen |
| 6,456,060 B1 | * | 9/2002 | Wiesemann ........... G01R 19/14 |
| | | | 324/127 |
| 9,366,698 B2 | | 6/2016 | Legros et al. |
| 2009/0058399 A1 | | 3/2009 | Wang et al. |
| 2010/0123454 A1 | | 5/2010 | Liu |
| 2010/0148756 A1 | | 6/2010 | Shah et al. |

* cited by examiner

CLAMP METER

BACKGROUND

Technical Field

The present application relates to electronic measurement technology, and more particularly to a clamp meter.

Description of the Related Art

Various measurement devices for measuring electronic parameters such as voltage, current or resistance has been widely used in industrial production and daily life. A clamp meter is a typical current measurement device capable of measuring a current flow in an electric wire without interrupting the current flow.

The clamp meter generally has two clamp jaws movable in relation to each other. During measurement, distal ends of the two clamp jaws meet to substantially engage with each other. However, due to mis-operation or accidents, it frequently happens that the two clamp jaws are separate from each other and cannot form the closed loop required for measurement.

BRIEF SUMMARY

An objective of the present application is to provide a clamp meter to avoid separation of its clamp jaws during measurement.

In one aspect of the present application, there is disclosed a clamp meter. The clamp meter comprises a meter body, and a clamp jaw assembly mounted to the meter body, the clamp jaw assembly comprising a first clamp jaw and a second clamp jaw which are movable in relation to each other between a closed position and an open position, wherein in the closed position distal ends of the first and second clamp jaws meet to define an enclosed area between the first and second clamp jaws, and in the open position the distal ends of the first and second clamp jaws are separate from each other to define a gap allowing a wire under test to pass therethrough. The clamp meter further comprises a locking member mounted within the meter body, wherein the locking member is operable to releasably lock the first and second clamp jaws in the closed position.

Via the locking member, the two clamp jaws can be locked in the closed position when required. Consequently, during measurement, the two clamp jaws will not be separate from each other due to mis-operation or accidents, thereby improving the stability of the measurement using the clamp meter.

In certain embodiments, the first clamp jaw has a proximal end opposite to its distal end and movable relative to the meter body; and wherein the locking member comprises a locking slider operatively received within a slot inside the meter body, wherein the locking slider is slidable between a locked position and an unlocked position, in the locked position the locking slider abuts against an inner side of the proximal end of the first clamp jaw to block the first clamp jaw from movement, and in the unlocked position the locking slider moves away from the inner side of the proximal end of the first clamp jaw to allow the first clamp jaw to move; and a switch assembly mounted to the proximal end of the first clamp jaw, wherein the switch assembly is operatively coupled to the locking slider to move the locking slider between the locked position and the unlocked position.

In certain embodiments, the proximal end of the first clamp jaw follows a trajectory of movement when the first clamp jaw moves, and the slot has an opening profile tangent with or at least partially overlapping with the trajectory of movement of the proximal end of the first clamp jaw.

In certain embodiments, in the locked position the locking slider intersects with the trajectory of movement of the proximal end of the first clamp jaw to block the first clamp jaw from movement.

In certain embodiments, wherein the locking slider has a top slope for operatively engaging with the switch assembly to receive an unlocking force that pushes the locking slider into the slot to the unlocked position.

In certain embodiments, the locking member further comprises a first biasing element disposed between the locking slider and the slot and for exerting to the locking slider a biasing force that pushes the locking slider partially out of the slot to the locked position.

In certain embodiments, the switch assembly comprises a switch button having a button portion and a rod portion, and wherein by operation of the button portion, the rod portion operatively engages with the locking slider and exerts to the locking slider an unlocking force that pushes the locking slider into the slot to the unlocked position.

In certain embodiments, the switch button is slidable inside the proximal end of the first clamp jaw such that translational movement of the switch button and the rod portion is converted into the unlocking force when the rod portion engages with the locking slider.

In certain embodiments, the switch button is rotatable about a pivot at the first clamp jaw such that rotational movement of the switch button and the rod portion is converted into the unlocking force when the rod portion engages with the locking slider.

In certain embodiments, the switch assembly further comprises a second biasing element for exerting to the switch button a biasing force for releasing the rod portion of the switch button from the locking slider.

In certain embodiments, the button portion is positioned at a trigger portion at an outer side of the proximal end of the first clamp jaw, and wherein by operation of the button portion and the trigger portion towards the meter body, the locking slider moves from the locked position to the unlocked position, and the locking member releases the first and second clamp jaws to move from the closed position to the open position.

In certain embodiments, the first clamp jaw is pivotally mounted to the meter body for pivoting movement relative to the second clamp jaw which is fixedly mounted to the meter body.

In certain embodiments, each of the first and second clamp jaws has a shield and a clamp jaw core made of soft magnetic alloy.

In certain embodiments, each clamp jaw core is stacked by multiple soft magnetic alloy sheets.

In certain embodiments, the stacked soft magnetic alloy sheets of the two clamp cores define tooth-like profiles at distal ends of the first clamp jaw and the second clamp jaw respectively such that the distal ends of the two clamp jaw cores can interlock with each other.

In certain embodiments, each shield is stacked by multiple soft magnetic alloy sheets.

The foregoing has outlined, rather broadly, features of the present application. Additional features of the present application will be described, hereinafter, which form the subject of the claims of the present application. It should be appreciated by those skilled in the art that the conception and specific embodiments disclosed herein may be readily utilized as a basis for modifying or designing other structures or processes for carrying out the objectives of the present application. It should also be realized by those skilled in the art that such equivalent constructions do not depart from the spirit and scope of the present application as set forth in the appended claims.

BRIEF DESCRIPTION OF THE SEVERAL VIEWS OF THE DRAWINGS

The aforementioned features and other features of the present application will be fully understood by reading the following description by referring to the accompanying drawings and the appended claims. It will be understood that, these accompanying drawings merely illustrate certain embodiments in accordance with the present application and should not be considered as limitation to the scope of the present application. Unless otherwise specified, the accompanying drawings need not be proportional, and similar reference characters generally denote similar elements.

DETAILED DESCRIPTION

The following detailed description refers to the accompanying drawings which is a part of the present application. The illustrative embodiments described in the detailed description, the accompanying drawings and the claims are not limiting, and other embodiments may be adopted, or modifications may be made without deviating from the spirit and subject of the present application. It should be understood that the various aspects of the present application described and graphically presented herein may be arranged, replaced, combined, divided and designed in many different configurations, and these different configurations are implicitly comprised in the present application.

Figure 1:
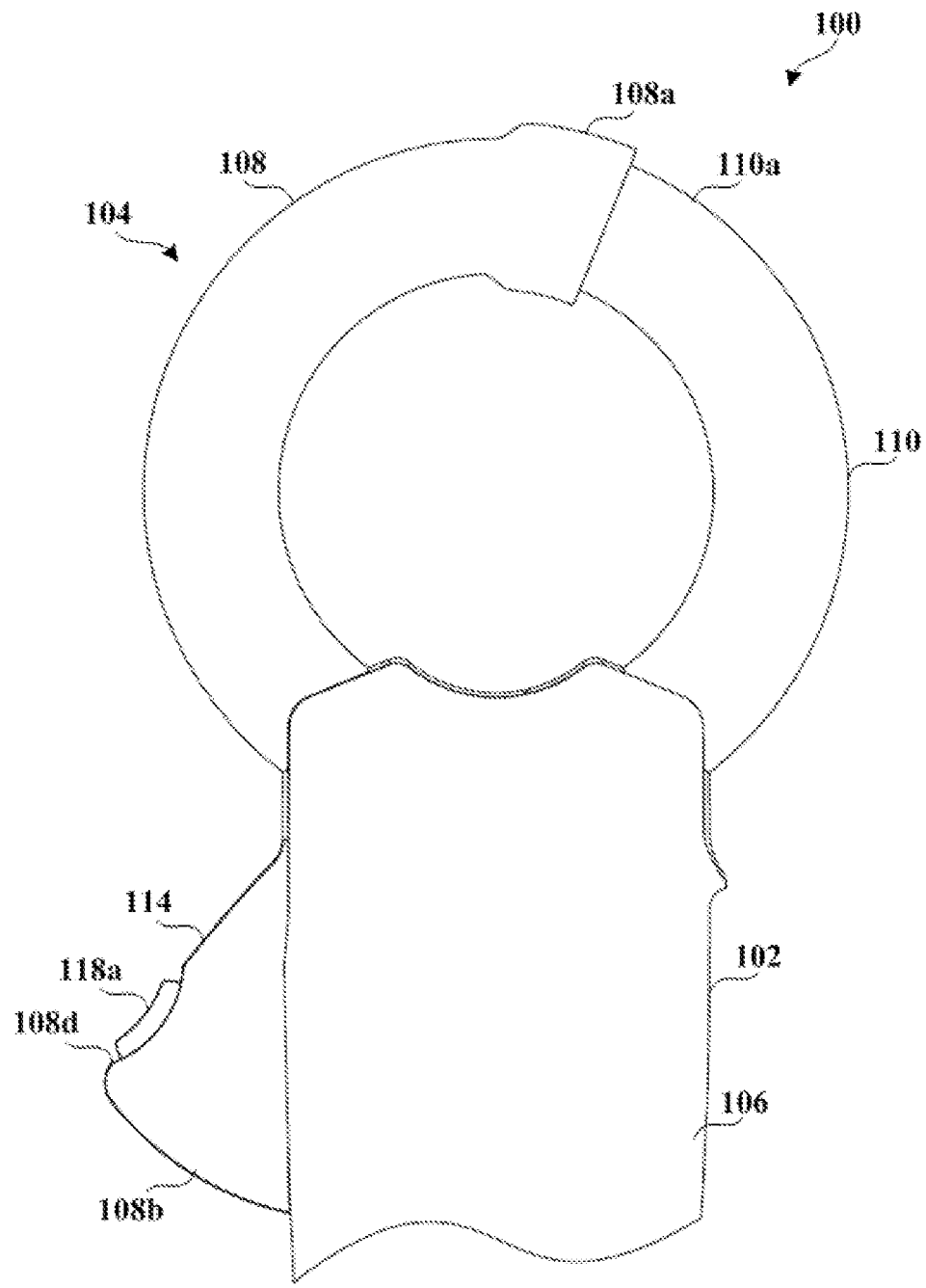
FIG. 1 is an illustration of a clamp meter according to an embodiment of the present application.
Figure 2:
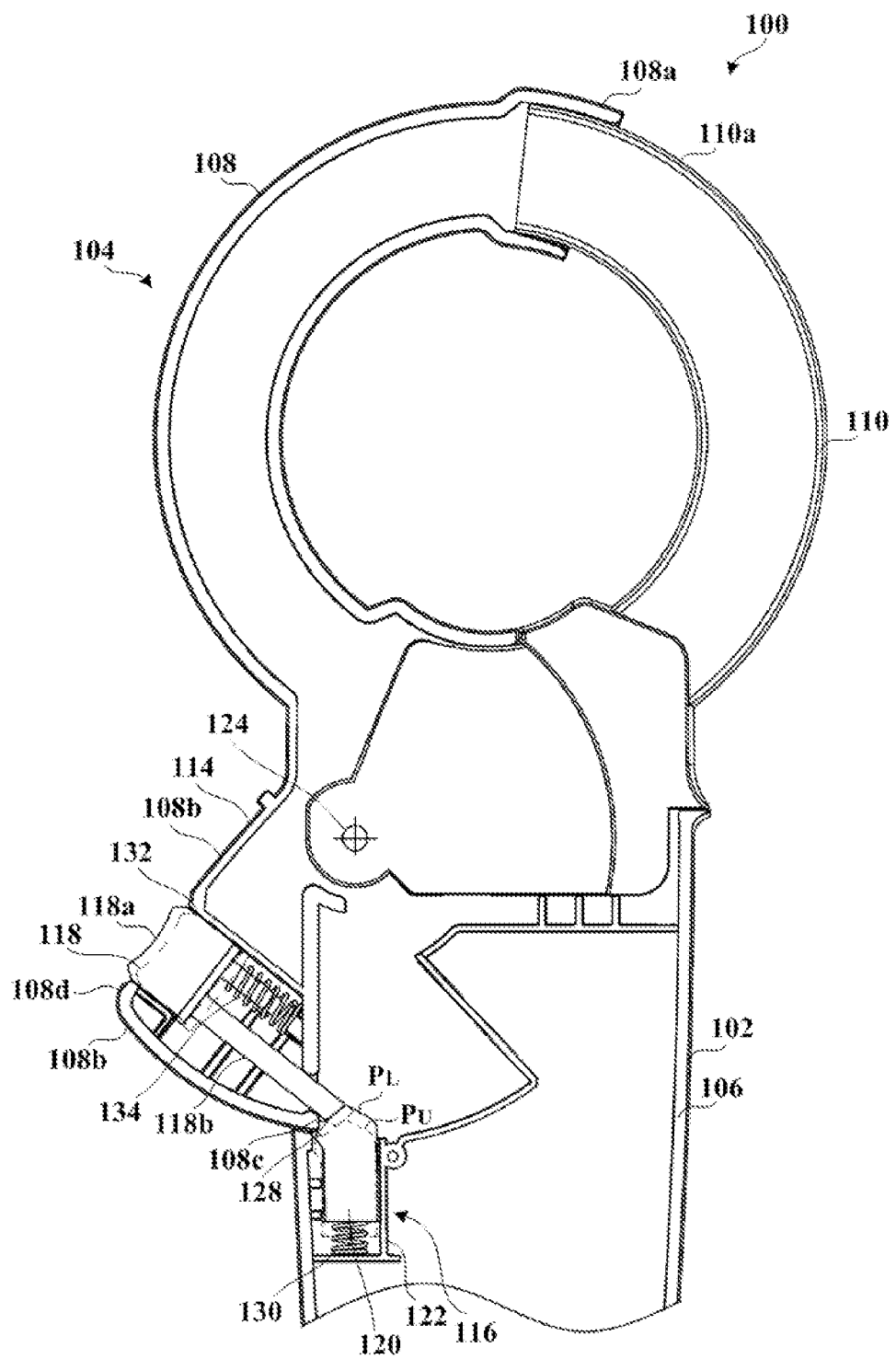
FIG. 2 is an illustration of the clamp meter in FIG. 1 and a portion of its inner structure when it is in a closed position.
Figure 3:
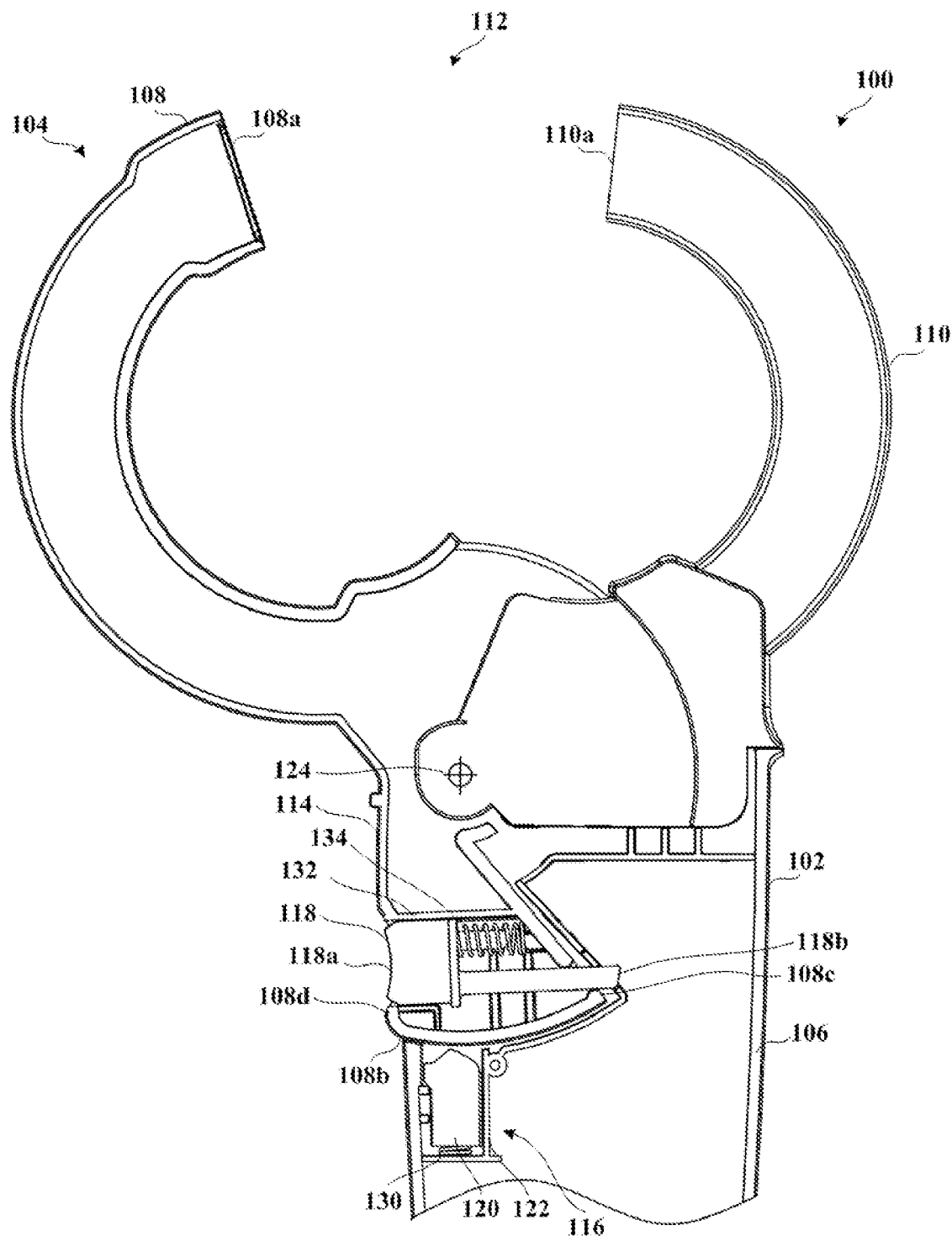
FIG. 3 is an illustration of the clamp meter in FIG. 1 and a portion of its inner structure when it is in an open position.

FIGS. 1 to 3 show a clamp meter 100 according to an embodiment of the present application. FIG. 1 is an exterior structure of the clamp meter 100, and FIGS. 2 and 3 show the clamp meter 100 and a portion of its inner structure when it is in a closed position and in an open position, respectively. In certain embodiments, the clamp meter 100 can be used to measure a current flow in an electric wire.

As shown in FIG. 1, the clamp meter 100 includes a meter body 102 and a clamp jaw assembly 104. The clamp jaw assembly 104 is mounted to the meter body 102 and extends from the meter body 102. The meter body 102 has a body housing 106 made of a lightweight material such as plastic, and the body housing 106 is adapted to enclose typical electrical and mechanical components of the clamp meter 100, e.g. a measurement and control circuit. The body housing 106 may be configured with control buttons, knobs, switches, a display screen (not shown) and etc.

The clamp jaw assembly 104 includes a first clamp jaw 108 and a second clamp jaw 110. The first clamp jaw 108 is pivotally mounted to the meter body 102, and the second clamp jaw 110 is fixedly mounted to the meter body 102. The first clamp jaw 108 is rotatable in relation to the second clamp jaw 110. In certain other embodiments, the first clamp jaw 108 may be slidably mounted to the meter body 102 such that it can slide in relation to the second clamp jaw 110. The first clamp jaw 108 and the second clamp jaw 110 are movable in relation to each other, which enables them to switch between a closed position shown in FIG. 2 and an open position shown in FIG. 3.

In the closed position shown in FIG. 2, the distal end 108a of the first clamp jaw 108 and the distal end 110a of the second clamp jaw 110 meet, such as be in contact with or engage with each other, to define an enclosed area between the first clamp jaw 108 and the second clamp jaw 110. The first clamp jaw 108 and the second clamp jaw 110 both have inductance coils at their inside space. When the first clamp jaw 108 and the second clamp jaw 110 are in the closed position and a wire under test passes through the enclosed area between the first clamp jaw 108 and the second clamp jaw 110, the inductance coils can sense a change in the current flow in the wire under test to generate a sensing current indicative of the amplitude of the current flow being tested. In some cases, in the closed position, the distal end 108a of the first clamp jaw 108 and the distal end 110a of the second clamp jaw 110 meet to form a gap therebetween (i.e. an air gap) sized less than or equal to a predetermined length. Under these circumstances, the inductance coils inside the first clamp jaw 108 and the second clamp jaw 110 can still sense the current flow in the wire under test and generate the sensing current at a required ratio. Moreover, in the open position shown in FIG. 3, the distal end 108a of the first clamp jaw 108 and the distal end 110a of the second clamp jaw 110 are separate from each other, defining an opening 112. The opening 112 is configured to at least allow the wire under test to pass through, such that the wire under test can move to a position between the first clamp jaw 108 and the second clamp jaw 110 for measurement.

Still referring to FIG. 1, the first clamp 108 has a proximal end 108b opposite to the distal end 108a, which can move, such as rotate, in relation to the meter body 102. The proximal end 108b has an inner side (see inner side 108c in FIGS. 2 and 3) close to the meter body 102, and an outer side 108d away from the meter body 102. In the embodiment shown in FIG. 1, the inner side of the proximal end 108b is substantially received within the meter body 102 while the outer side 108d of the proximal end 108b is positioned out of the meter body 102 and is operable by an operator. A trigger 114 is generally positioned at the outer side 108d of the proximal end 108b of the first clamp jaw 108.

Specifically, a lateral side of the body housing 106 has a housing opening (not shown) allowing the proximal end 108b of the first clamp jaw 108 to pass through. The operator may operate the first clamp jaw 108, such as pressing the trigger 114 at the outer side 108d of the proximal end 108b towards the meter body 102, such that a portion or the entirety of the proximal end 108b can pass through the housing opening into the meter body 102, leaving the first and second clamp jaws 108 and 110 in the open position. The operator may rotate the distal end 108a of the first clamp jaw 108 clockwise, such that the distal end 108a is close to the distal end 110a of the second clamp jaw 110, and a portion or all of the proximal end 108b is moved out of the meter body 102 through the housing opening. In this way, the first clamp jaw 108 and the second clamp jaw 110 can be moved to the closed position. In certain embodiments, the first clamp jaw 108 can be biased to the closed position by a spring.

As shown in FIGS. 2 and 3, the clamp meter 100 further includes a locking member 116 mounted within the meter body 102. The locking member 116 releasably locks the first clamp jaw 108 and the second clamp jaw 110 in the closed position. In other words, the locking member 116 may lock the first clamp jaw 108 and the second clamp jaw 110 in the closed position, and when required, it can be operated to unlock the first clamp jaw 108 and the second clamp jaw 110 to allow the clamps jaws move from the closed position to the open position.

The locking member 116 includes a locking slider 120 operatively received within a slot 122 inside the meter body 102. The slot 122 may extend in an elongated or curved shape. Under the direction of the slot 122, the locking slider 120 can slide in an extending direction of the slot 122, and particularly, between a locked position $P_L$ and an unlocked position $P_U$ shown in FIG. 2. The locking member 116 further includes a switch assembly mounted to the proximal end 108b of the first clamp jaw 108. By operation of the switch assembly such as pressing or operation in another manner, the operator can control the locking member 116 to unlock the first and second clamp jaws 108 and 110.

Specifically, as shown in FIG. 2, the switch assembly is operatively coupled to the locking slider 120 to enable the locking slider 120 to move between the locked position $P_L$ and an unlocked position $P_U$. In certain embodiments, the switch assembly may include a switch button 118 having a button portion 118a and a rod portion 118b. The rod portion 118b operatively engages with the locking slider 120, and the two portions of the switch button 118 are secured together, so that pressure or other force applied to the button portion 118a can be transmitted to the rod portion 118b, and further to the locking slider 120.

In the locked position $P_L$, a lower portion of the locking member 120 is received within the slot 122 but its upper portion is out of the slot 122 to abut against the inner side 108c of the proximal end of the first clamp jaw 108, thereby preventing the first clamp jaw 108 from rotating counterclockwise. Under such circumstance, since the distal end 108a of the first clamp jaw 108 and the distal end 110a of the second clamp jaw 110 are close to each other, the first clamp jaw 108 and the second clamp jaw 110 are locked in the locked position. However, when the operator operates the button portion 118a to unlock the locking member 116, for example, by pressing the button portion 118a downward, the button portion 118a can move the rod portion 118b and apply an unlocking force to the locking slider 120 via the rod portion 118. The unlocking force pushes the locking slider 120 into the slot 122 and positions it in the unlocked position $P_U$.

In the unlocked position $P_U$, the locking slider 120 is substantially pushed into the slot 122 and moved to a position away from the inner side 108c of the proximal end of the first clamp jaw 108. Compared with the locked position $P_L$, the locking slider 120 in the unlocked position $P_U$ is far away from the inner side 108c of the proximal end of the first clamp jaw 108, and is pressed against the slot 122 by the proximal end 108b of the first clamp jaw 108. In this way, the first clamp jaw 108 is no longer blocked by the locking slider 120, and can rotate counterclockwise from the closed position shown in FIG. 2 to the open position shown in FIG. 3. As shown in FIG. 3, as the switch button 118 is mounted within the first clamp jaw 108, its position changes with the rotation of the first clamp jaw 108. After the first clamp jaw 108 rotates counterclockwise towards the open position, the rod portion 118b of the switch button 118 no longer engages with the locking slider 120.

In certain embodiments, the locking slider 120 may have a top slope 128 on the top of the locking slider 120, which operatively engages with the locking member 116, and particularly, with the rod portion 118b of the switch button 118. In this way, when the rod portion 118b is pushed towards the meter body 102 to release the locking slider 120, the top slope 128 may receive the unlocking force and resolve it partially in a depth direction of the slot 122, thereby the locking slider is pushed into the slot 122 to the unlocked position. In certain embodiments, the top slope 128 is angled with respect to the depth direction of the slot 122 at an acute angle such as 30 to 60 degrees.

In certain embodiments, when the first clamp jaw 108 moves, its proximal end 108b moves following a trajectory of movement. For example, as to the embodiment shown in FIGS. 1 to 3, the first clamp jaw 108 rotates about an rotation axis 124 such that the trajectory of movement of the proximal end 108b is substantially a curved line with the rotation axis 124 as a center of circle. It should be noted that the trajectory of movement is a trajectory followed by the outermost of the proximal end 108b (e.g. with respect to the rotation axis 124), rather than that followed by the entire portion of the proximal end 108b. In certain other embodiments, the first clamp jaw 108 may move linearly, and correspondingly the proximal end 108b follows a linear trajectory of movement.

When the locking slider 120 intersects with the trajectory of movement of the proximal end 108b, the locking slider 120 may block the movement of the first clamp jaw 108 to lock its position. In certain embodiments, the slot 122 may have an opening profile. The opening profile refers to a plane or a curved face virtually defined by a top surface (e.g. at a slot opening of the slot 122) of the walls of the slot 122, which faces towards the distal ends of the first and second clamp jaws 108 and 110. In certain embodiments, the opening profile may be close to the trajectory of movement of the proximal end 108b of the first clamp jaw 108 but does not affect the movement of the proximal end 108b. The distance from the opening profile to the trajectory of movement of the proximal end 108 mainly depend on a distance of travel that the locking slider 120 can move out of the slot 122. In certain embodiments, the opening profile of the slot 122 at least partially matches with the trajectory of movement of the proximal end 108b and is at certain distance from such trajectory, for example, the distance from the opening profile to the trajectory of movement at a closest point is equal to or great than zero, such as 0.2 to 2 millimeters, 0.2 to 1.0 millimeter, or 0.2 to 0.5 millimeter. In certain embodiments, the opening profile may be, either internally or externally, tangent with the trajectory of movement of the proximal end 108b of the first clamp jaw 108 at certain point, or at least partially overlap with such trajectory, which generally depends on the machining accuracy and tolerance of the components of the clamp meter 100 such as the first clamp jaw, the slot, the meter body and the locking slider. As such, when the locking slider 120 is substantially received within the slot 122, the locking slider 120 and the slot 122 may not affect the rotation of the first clamp jaw 108. And when the locking slider 120 moves partially out of the slot 122, the locking slider 120 may intersect with the trajectory of movement of the proximal end 108b to block the movement of the first clamp jaw 108.

In certain embodiments, the locking member 116 further includes a first biasing element 130 such as a biasing spring, which is positioned between the locking slider 120 and a base of the slot 122. When the first biasing element is relaxed, the locking slider 120 is partially out of the slot 122. Consequently, when being compressed, the first biasing element 130 may exert to the locking slider 120 a biasing force that pushes the locking slider 120 partially out of the slot 122 to the locked position $P_L$. In certain embodiments, the biasing spring may be connected to a lower surface of the locking slider 120 and the base of the slot 122 to avoid separation of the locking slider 120 from the slot 122. In certain other embodiments, a coupling element may be used to connect the locking slider 120 and the slot 122. For example, the coupling element may include a rod and a sleeve, and the rod is slidable within the sleeve but inseparable from sleeve. Each of the rod and the sleeve has an end attached to the lower surface of the locking slider 120 and the base of the slot 122, respectively. Under such configuration, the biasing spring may not be directly connected to the lower surface of the locking slider 120 and the base of the slot 122.

The switch assembly for unlocking the locking slider 120 may have different structures. In the embodiment shown in FIGS. 2 and 3, the switch button 118 of the switch assembly is slidable inside the proximal end 108*b*, for example, within a channel 132 inside the proximal end 108*b*, such that, when the rod portion 118*b* engages with the locking slider 120, translational movement of the button portion 118*a* and the rod portion 118*b* is converted the unlocking force that pushes the locking slider 120 into the slot 122. In certain embodiments, the locking assembly 116 may further include a second biasing element 134 such as a biasing spring positioned between the switch button 118 and a housing of the first clamp jaw 108. When the second biasing element 134 is relaxed, the rod portion 118*b* of the switch button 118 is not in contact with the locking slider 120 such that the locking slider 120 is maintained in the locked position. When the button portion 118*a* is pushed to compress the second biasing element 134, the rod portion 118*b* may move towards the locking slider 120 and push it to the unlocked position. Therefore, the second biasing element 134 may exert to the switch button 118 a biasing force for releasing the rod portion 118*b* of the switch button 118 from the locking slider 120.

Figure 4:
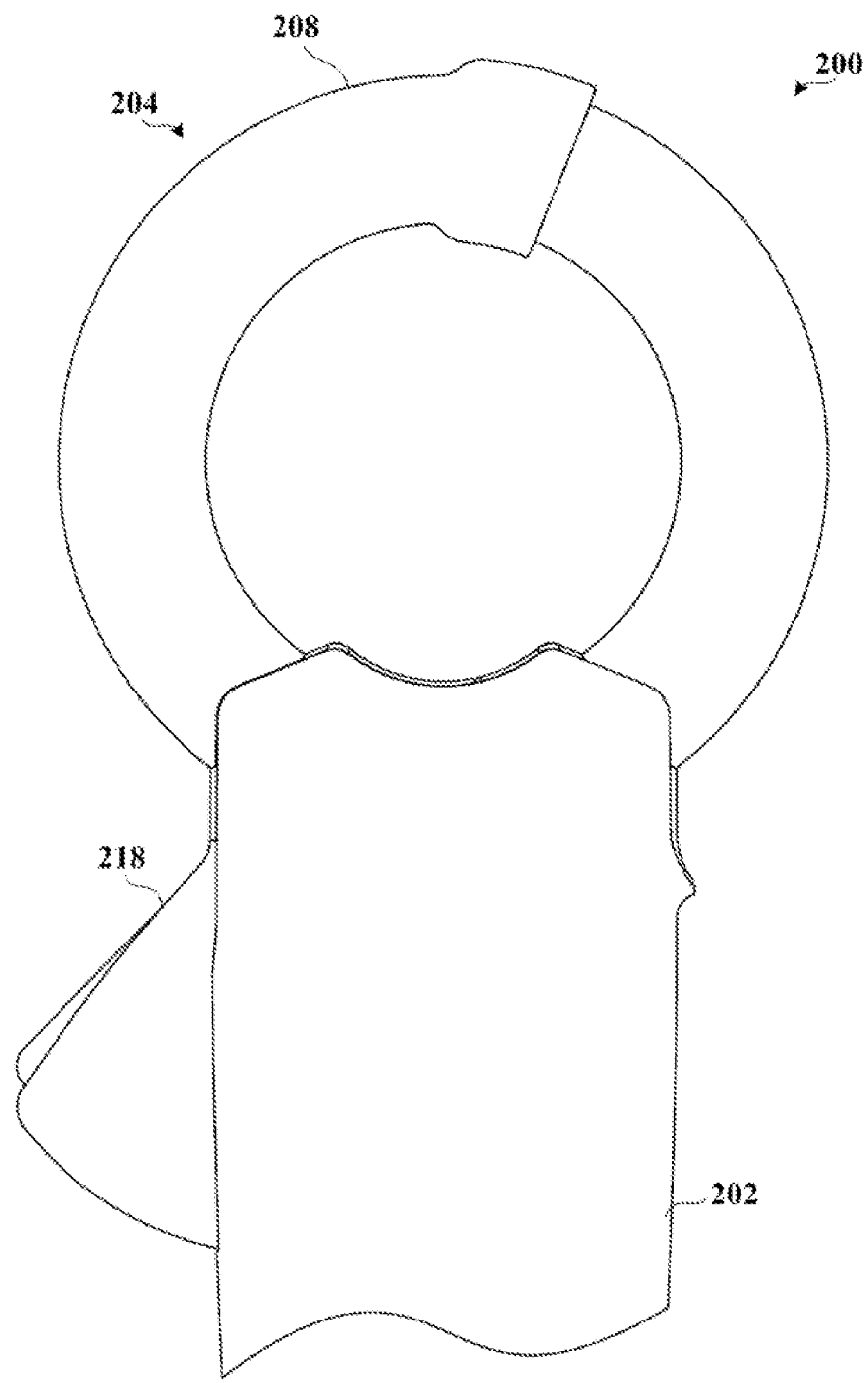
FIG. 4 is an illustration of a clamp meter according to another embodiment of the present application.
Figure 5:
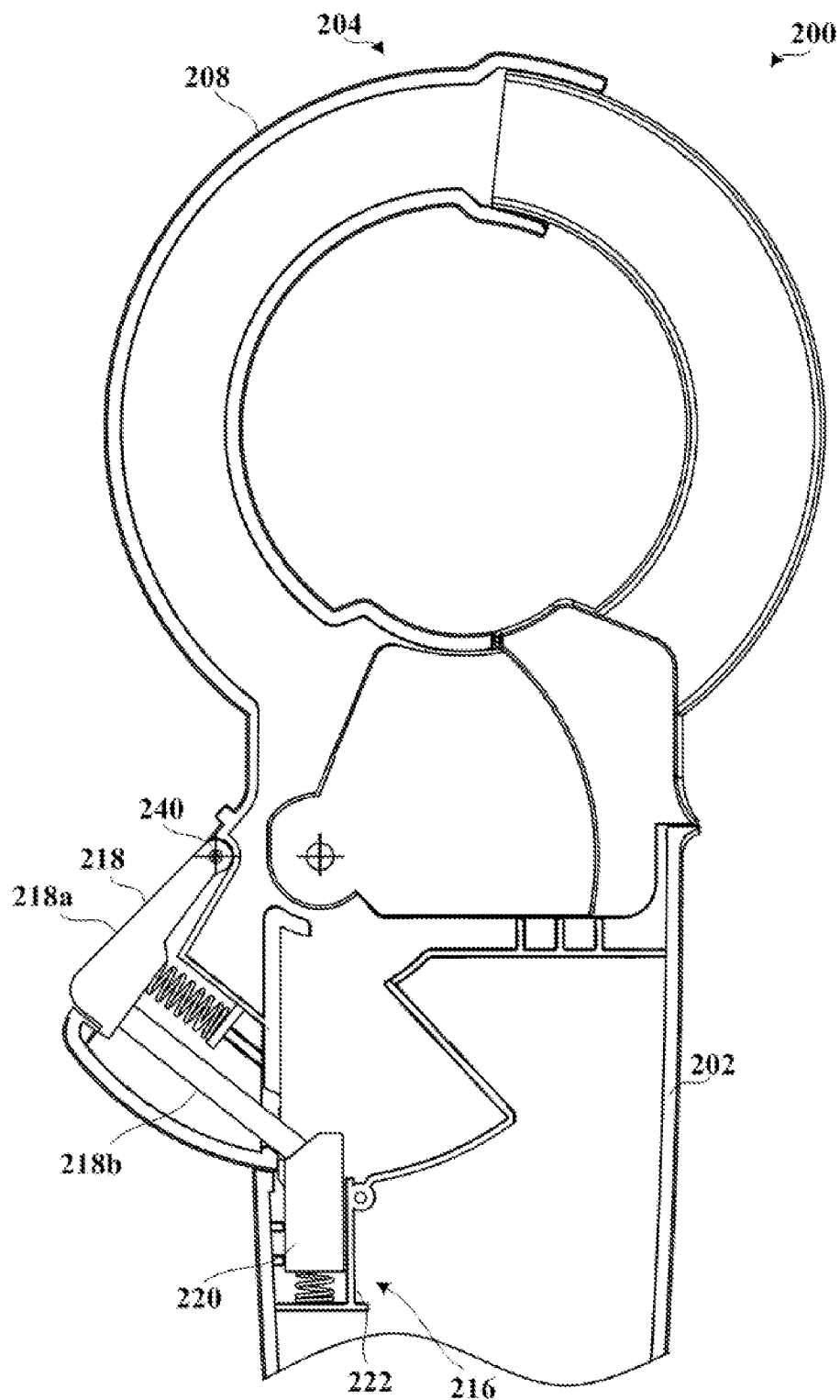
FIG. 5 is an illustration of the clamp meter in FIG. 4 and a portion of its inner structure when it is in a closed position.
Figure 6:
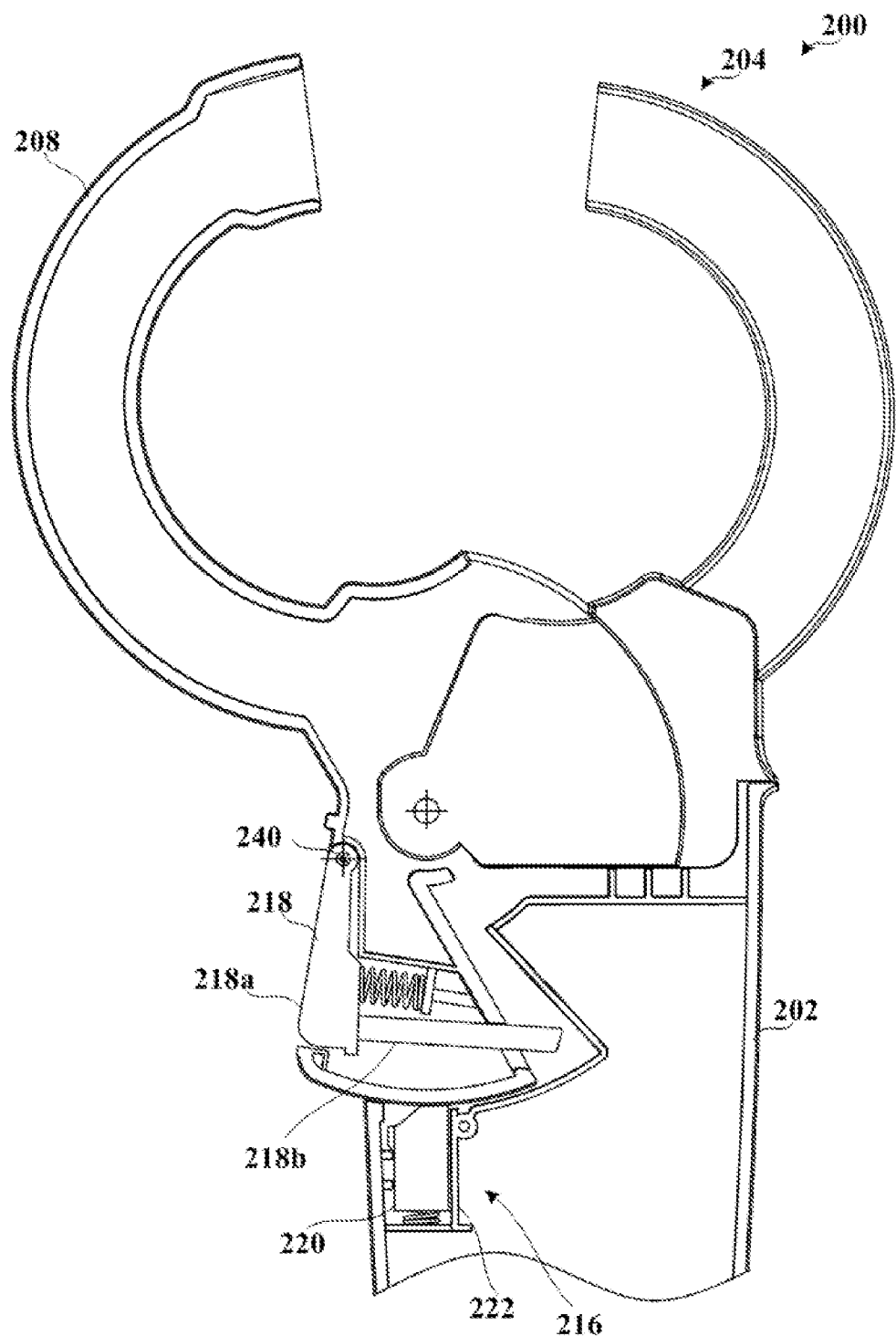
FIG. 6 is an illustration of the clamp meter in FIG. 4 and a portion of its inner structure when it is in an open position.

FIGS. 4 to 6 show a clamp meter 200 according to another embodiment of the present application. FIG. 4 is an exterior structure of the clamp meter 200, and FIGS. 5 and 6 show the clamp meter 200 in FIG. 4 and a portion of its inner structure when it is in a closed position and in an open position, respectively.

As shown in FIGS. 4 to 6, similar to the clamp meter 100 shown in FIGS. 1 to 3, the clamp meter 200 includes a meter body 202, a clamp assembly 204 and a locking member 216. The locking member 216 includes a switch button 218 with a button portion 218*a* and a rod portion 218*b*. Different from the clamp meter 100, the switch button 218 is pivotally mounted to the first clamp jaw 208 and rotatable about a pivot 240 at the first clamp jaw 208. In this way, when the rod portion 218*b* engages with the locking slider 220, the rotational movement of the button portion 218*a* and the rod portion 218*b* is converted into an unlocking force that pushes the locking slider 220 into a slot 222 to an unlocked position.

In the clamp meter 100 shown in FIGS. 1 to 3 or the clamp meter 200 shown in FIGS. 4 to 6, the button portions of the switch buttons are all positioned at a trigger portion at the outer side of the proximal end of the first clamp jaw. In this way, by operation of the button portion and the trigger portion towards the meter body, the locking slider can be moved from the locked position to the unlocked position, and the locking member unlocks the locking slider and releases the first and second clamp jaws to move from the closed position to the open position. In other words, the operator may unlock and open the clamp jaw assembly at the same time, without any additional operation. This facilitates the operation and use of the clamp meters of the present application.

Figure 7:
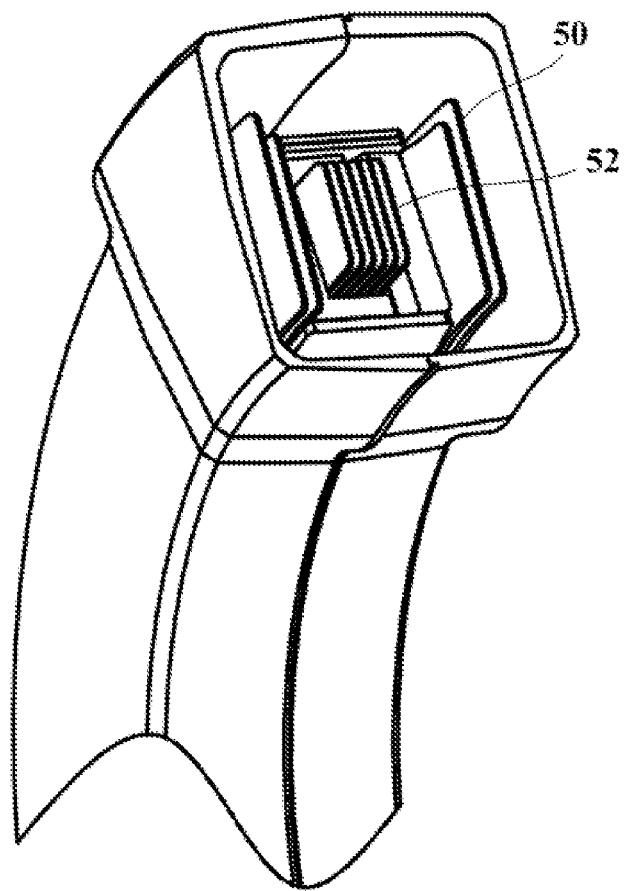
FIG. 7 is an exemplary structure of distal ends of the clamp meter shown in FIGS. 1 to 3 or FIGS. 4 to 6.

FIG. 7 is an exemplary structure of distal ends of the clamp meter shown in FIGS. 1 to 3 or FIGS. 4 to 6.

As shown in FIG. 7, each clamp jaw may have a shield 50 and a clamp jaw core 52 made of soft magnetic alloy. In certain embodiments, each clamp jaw core 52 is made of a stack of multiple soft magnetic alloy sheets. In certain embodiments, the stacked soft magnetic alloy sheets of the two clamp cores define tooth-like profiles at distal ends of the first clamp jaw and the second clamp jaw respectively. For example, adjacent sheets may have different lengths, and the distal end of the second clamp jaw core may have a stacked structure matching with that of the first clamp jaw core. Consequently, when the distal ends of the clamp jaws meet, the two stacks of soft magnetic alloy sheets can interlock with each other at their distal ends. In certain embodiments, the soft magnetic alloy sheets of the clamp jaw core have a thickness of 0.05 to 1.5 millimeters, e.g. 0.1, 0.2, 0.5 or 1.0 millimeter. In certain embodiments, the soft magnetic alloy sheets of the clamp jaw core have a thickness of 0.1 to 1.0 millimeter, 0.2 to 1.0 millimeter or 0.5 to 1.0 millimeter. In certain embodiments, each shield of the clamp jaws may be also made of a stack of soft magnetic alloy sheets, which have a thickness of 0.05 to 2.0 millimeters, e.g. 0.1, 0.2, 0.5, 1.0 or 1.5 millimeters. In certain embodiments, the soft magnetic alloy sheets of the shield have a thickness of 0.1 to 1.0 millimeter, 0.2 to 1.0 millimeter or 0.5 to 1.0 millimeter.

With the locking member, the clamp jaws of the clamp meter of the present application can be kept in the closed position to avoid separation of their distal ends. In this way, even if the clamp meter falls off from a high position due to mis-operation, the clamp jaws locked in the closed position can prevent their clamp jaw cores from hitting onto the ground, thereby protecting the clamp jaws cores effectively.

It should be noted that, although several modules or sub-modules of the clamp jaw have been described in the previous paragraphs, such division is exemplary and not mandatory. Practically, according to the embodiments of the present application, the functions and features of two or more modules described above may be embodied in one module. On the other hand, the function and feature of any one module described above may be embodied in two or more modules.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. Any reference signs in the claims should not be construed as limiting the scope. The scope and spirit of the present application is defined by the appended claims.

What is claimed is:

1. A clamp meter, comprising:
   a meter body;
   a clamp jaw assembly mounted to the meter body, the clamp jaw assembly comprising a first clamp jaw and a second clamp jaw that are movable in relation to each other between a closed position and an open position, the first clamp jaw and the second clamp jaw each having a distal end and a proximal end opposite to the distal end, wherein in the closed position the distal ends of the first and second clamp jaws meet to define an enclosed area between the first and second clamp jaws, and in the open position the distal ends of the first and second clamp jaws separate from each other to define a gap that allows a wire under test to pass therethrough into the enclosed area;

a locking slider positioned within a slot inside the meter body, wherein the locking slider is slidable longitudinally within the slot between a locked position and an unlocked position, wherein in the locked position the locking slider abuts against the proximal end of the first clamp jaw to block the first clamp jaw from movement, and in the unlocked position the locking slider is moved away from the proximal end of the first clamp jaw to allow the first clamp jaw to move relative to the second clamp jaw;

a first biasing element configured to exert to the locking slider a biasing force that pushes the locking slider toward the locked position; and a switch assembly operatively coupled to the locking slider to move the locking slider longitudinally within the slot between the locked position and the unlocked position.

2. The clamp meter of claim 1, wherein the switch assembly is mounted to the proximal end of the first clamp jaw.

3. The clamp meter of claim 1, wherein the proximal end of the first clamp jaw follows a trajectory of movement when the first clamp jaw moves, and the slot has an opening profile tangent with or at least partially overlapping with the trajectory of movement of the proximal end of the first clamp jaw.

4. The clamp meter of claim 3, wherein in the locked position the locking slider intersects with the trajectory of movement of the proximal end of the first clamp jaw to block the first clamp jaw from movement.

5. The clamp meter of claim 1, wherein the locking slider has a top slope that operatively engages with the switch assembly to receive an unlocking force that resolves at least partially in a depth direction of the slot and pushes the locking slider longitudinally into the slot toward the unlocked position.

6. The clamp meter of claim 1, wherein the switch assembly comprises a switch button having a button portion and a rod portion secured to the button portion, and wherein by operation of the button portion, the rod portion operatively engages the locking slider and exerts to the locking slider an unlocking force that pushes the locking slider into the slot toward the unlocked position.

7. The clamp meter of claim 6, wherein the switch button is slidable inside the meter body such that translational movement of the button portion and the rod portion produces the unlocking force that pushes the locking slider into the slot when the rod portion engages with the locking slider.

8. The clamp meter of claim 6, wherein the switch button is rotatable about a pivot such that rotational movement of the button portion and the rod portion produces the unlocking force that pushes the locking slider into the slot when the rod portion engages with the locking slider.

9. The clamp meter of claim 6, wherein the switch assembly further comprises a second biasing element that exerts to the switch button a biasing force that causes the rod portion of the switch button to not push the locking slider into the slot.

10. The clamp meter of claim 6, further comprising a trigger portion, wherein the button portion is positioned with the trigger portion and by operation of the button portion and the trigger portion, the locking slider moves from the locked position toward the unlocked position which allows the first clamp jaw and the second clamp jaws to move from the closed position to the open position.

11. The clamp meter of claim 1, wherein the first clamp jaw is pivotally mounted to the meter body for pivoting movement relative to the second clamp jaw which is fixedly mounted to the meter body.

12. The clamp meter of claim 1, wherein each of the first and second clamp jaws has a shield and a clamp jaw core made of soft magnetic alloy.

13. The clamp meter of claim 12, wherein each clamp jaw core is stacked by multiple soft magnetic alloy sheets.

14. The clamp meter of claim 13, wherein the stacked soft magnetic alloy sheets of the two clamp jaw cores define tooth-like profiles at the distal ends of the first clamp jaw and the second clamp jaw respectively such that the tooth-like profiles of the two clamp jaw cores interlock with each other when the first clamp jaw and the second clamp jaws are in the closed position.

15. The clamp meter of claim 12, wherein each shield is stacked by multiple soft magnetic alloy sheets.

16. The clamp meter of claim 1, wherein the slot extends in a curved shape in the meter body.

17. The clamp meter of claim 1, wherein a switch button is mounted within the first clamp jaw such that a position of the switch button relative to the meter body changes with movement of the first clamp jaw.

18. The clamp meter of claim 1, wherein in the locked position the locking slider extends partially out of the slot to abut against the proximal end of the first clamp jaw and block the first clamp jaw from movement.

19. The clamp meter of claim 1, further comprising a coupling element that connects the locking slider and the slot, wherein the coupling element includes a rod that is that is slidable within a sleeve, and each of the rod and the sleeve has an end attached to a lower surface of the locking slider and a base of the slot, respectively.

20. The clamp meter of claim 1, wherein the slot extends in an elongated shape such that the locking slider is slidable longitudinally along a single axis within the slot between the locked position and the unlocked position.

* * * * *